United States Patent [19]

Koenig

[11] 4,009,485
[45] Feb. 22, 1977

[54] SEMICONDUCTOR PELLET ASSEMBLY MOUNTED ON CERAMIC SUBSTRATE
[75] Inventor: Paul W. Koenig, Clyde, N.Y.
[73] Assignee: General Electric Company, Syracuse, N.Y.
[22] Filed: Sept. 8, 1975
[21] Appl. No.: 611,239

Related U.S. Application Data
[63] Continuation-in-part of Ser. No. 535,670, Dec. 23, 1974.
[52] U.S. Cl. .............................. 357/68; 357/70; 357/79; 357/80; 357/81
[51] Int. Cl.² ............... H01L 23/48; H01L 29/44; H01L 29/52; H01L 29/60
[58] Field of Search .............. 357/70, 74, 79, 80, 357/81, 68

[56] References Cited
UNITED STATES PATENTS

| | | | |
|---|---|---|---|
| 3,292,056 | 12/1966 | Emeis et al. | 357/79 |
| 3,483,444 | 12/1969 | Parrish | 357/81 |
| 3,708,720 | 1/1973 | Whitney | 357/79 |
| 3,885,243 | 5/1975 | Weisshaar et al. | 357/74 |
| 3,916,433 | 10/1975 | Schierz | 357/79 |
| 3,922,775 | 12/1975 | Potter | 357/80 |
| 3,935,501 | 1/1976 | Sterbal | 357/75 |
| 3,938,177 | 2/1976 | Hansen et al. | 357/70 |

Primary Examiner—Andrew J. James
Attorney, Agent, or Firm—R. J. Mooney; D. E. Stoner

[57] ABSTRACT

Disclosed is an isolated semiconductor assembly with a pellet mounting plate having a beveled periphery and surmounted by a semiconductor pellet. A ribbon-shaped lead overhangs the edge of the top of the pellet and terminates in the plane of the lower side of the mounting plate. A ceramic substrate has conductive leads bonded thereto, portions of which are in registry with and bonded to the plate and ribbon-shaped lead. External connections can be made to other areas of the conductive leads.

22 Claims, 19 Drawing Figures

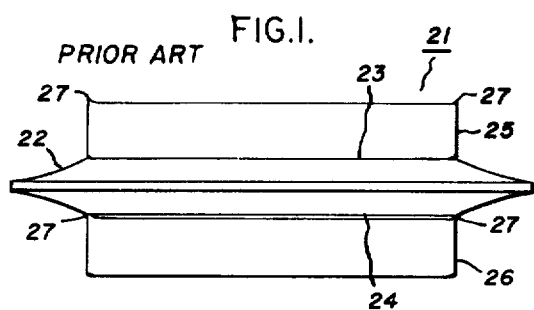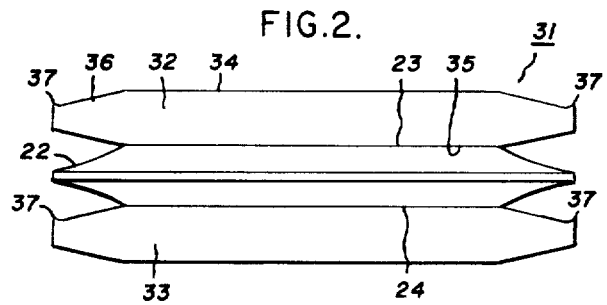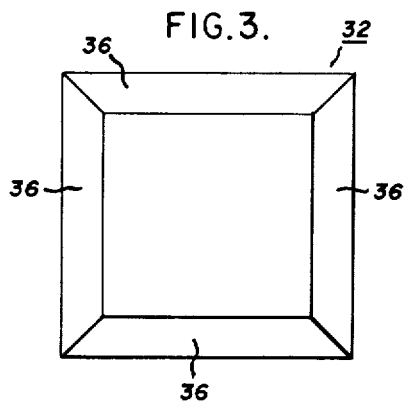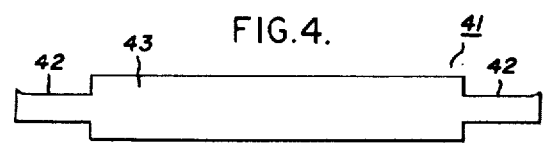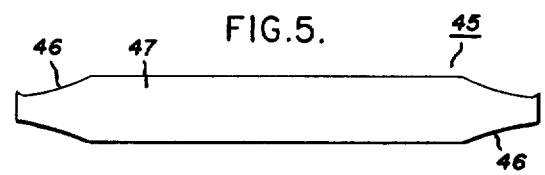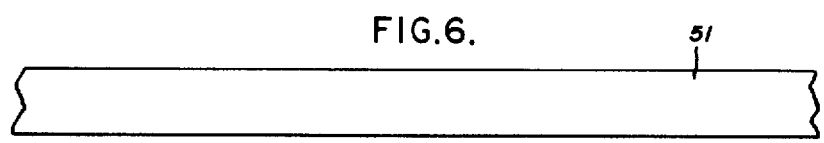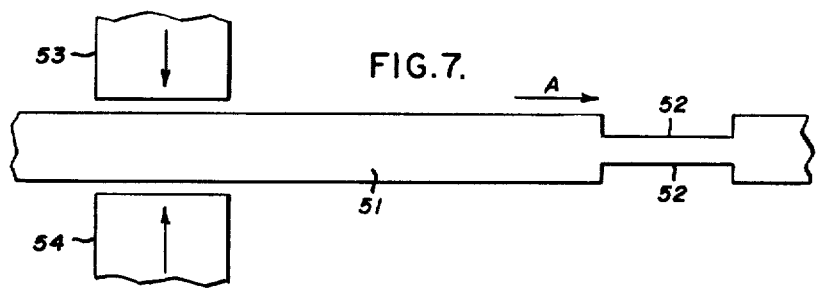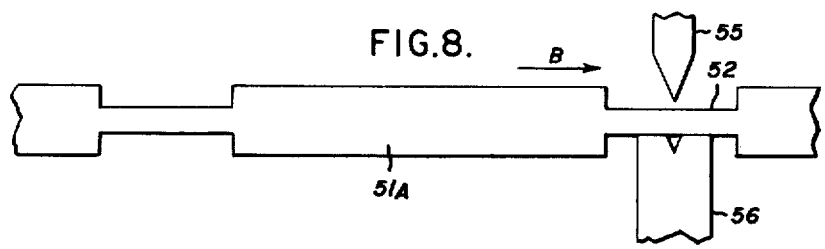

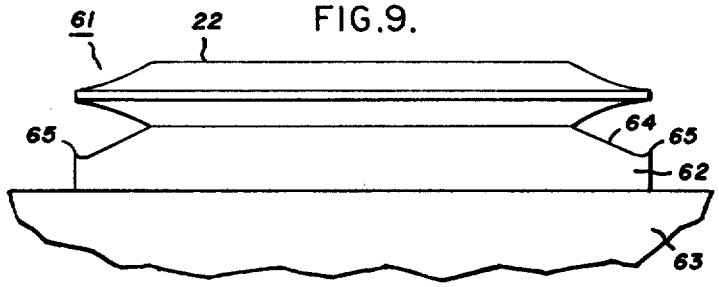
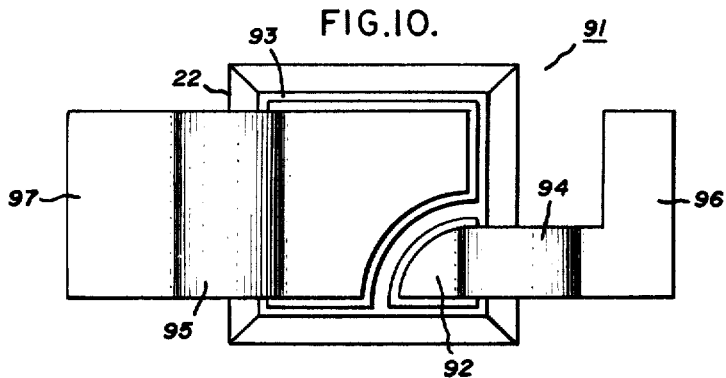
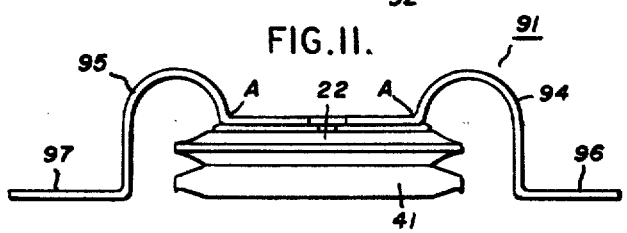
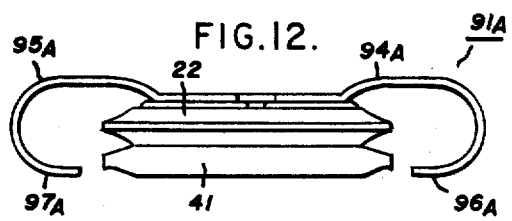
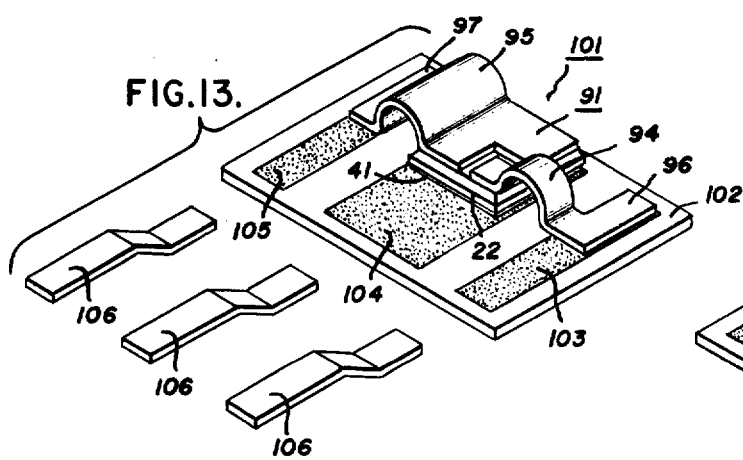
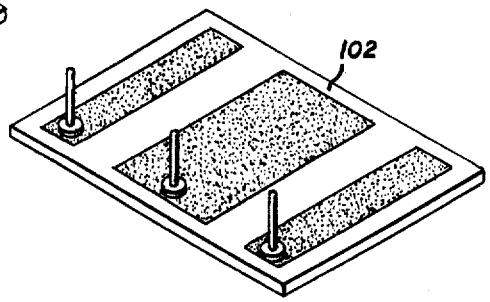

SEMICONDUCTOR PELLET ASSEMBLY MOUNTED ON CERAMIC SUBSTRATE

This application is a continuation-in-part of my copending application titled, "Semiconductor Assembly Including Mounting Plate With Recessed Periphery," filed Dec. 23, 1974, and assigned Ser. No. 535,670.

BACKGROUND OF THE INVENTION

This invention relates to semiconductor devices and, more particularly, to improved apparatus for mounting semiconductor device pellets and semiconductor assemblies employing the improved apparatus.

Semiconductor pellets are usually mounted with metal plates on one or both sides, the plates serving as a stress relief mechanism, a mechanical coupling system, heat and current spreaders or mechanical protection devices or any combination of the aforementioned functions. The plates are frequently substantially coextensive with the metallic contacts on the pellet. If the plates are smaller than the contacts, there may be insufficient current spreading to adequately utilize the entire conductive area of the semiconductor pellet and, furthermore, there may be inadequate thermal coupling to the pellet to effectively remove heat therefrom. If the plates are larger than the contact, the metal plate may overlie regions of the semiconductor pellet other than the region to which it is electrically coupled. Consequently, the chance of undesirable device breakdown is enhanced, and spurious, perhaps harmful, capacitances will be formed.

A problem that has developed in the use of these metal mounting plates stems from the fact that burrs are sometimes formed around the periphery thereof. The plates are generally stamped from large sheet stock, and a slightly dull die or apparatus out of adjustment may cause the burrs. Typically, the burrs will occur on only one side of the plate. If the burrs are adjacent the header to which the semiconductor pellet-metal plate laminate is to be mounted, the burrs may cause a spatial separation between the face of the metal plate and the header and thus prevent full contact of the plate and the header. Consequently, thermal coupling between the header and the pellet may be inadequate. Furthermore, the mechanical strength of the coupling will be diminished. If the burr is on the side adjacent the pellet, a potentially more serious problem can occur. If the metal plate is substantially the same size as the metallic contacts on the semiconductor pellet and, as is usual, the contact terminates prior to intersection with the periphery of the pellet, the burr rests on the surface of the semiconductive pellet. If pressure is applied during the process of bonding the plate and the pellet, the inordinately high pressure occurring under the burr can cause the brittle pellet to fracture and result in device failure.

Efforts to eliminate the burrs have resulted in a cost for the metal plates that is unacceptably high for many applications.

It is an object of this invention, therefore, to provide a metal mounting plate that overcomes the aforementioned disadvantages and to provide new semiconductor assemblies making use of the plate.

SUMMARY OF THE INVENTION

This invention is characterized by a metal mounting plate for semiconductor pellets, the plate defining two substantially parallel major surfaces, each with an interior planar region. A first one of the major surfaces is adapted to receive a semiconductor pellet and defines a peripheral transition region such that at least a portion of the peripheral corner of the first major surface is recessed from and out of the plane of the interior planar region. Depending upon the manufacturing steps chosen when making the plates, it may be necessary for the peripheral transition region to extend around the entire periphery, thus placing the entire peripheral edge out of the plane of the central planar region. The stamping is performed such that any burrs appear on the first major surface and the recess is chosen to be large enough that any burrs formed are without the plane of the interior planar region. Consequently, the aforementioned difficulties are overcome inasmuch as the burrs cannot contact either the pellet or the header to which the structure is to be mounted. Furthermore, punch life can be extended inasmuch as a certain amount of burring can be tolerated in the improved plate.

According to one embodiment disclosed herein, the mounting plate is surmounted by a semiconductor pellet having at least one metallic contact on each side thereof. A ribbon-shaped lead is bonded to the contact on the top of the semiconductor pellet. The ribbon-shaped lead overhangs the edge of the pellet and is contoured such that it terminates in a planar portion in the same plane as the bottom surface of the mounting plate. Thus, both terminals of the semiconductor pellet are co-planar, but can be separated as desired by selection of the length of the ribbon-shaped lead.

Conductive lead paths are formed on a ceramic substrate such that a bonding area of a lead path is in registry with and bonded to the lower surface of the mounting plate and a bonding area of another lead path is in registry with and bonded to the terminal portion of the ribbon lead. A contact area is provided on each conductive lead to facilitate connection with external circuitry as desired. Thus, it will be appreciated that there has been provided an isolated semiconductor pellet assembly which is low in cost due to its simplicity, yet can be effectively thermally coupled to a heat sink through the ceramic substrate.

It will be appreciated that if a three-leaded semiconductor device is desired, an additional ribbon-shaped lead and an additional conductive path can be provided to connect with a second contact on the upper surface of the semiconductor pellet.

An alternate isolated assembly is disclosed herein utilizing a triac pellet with a diac pellet mounted on the substrate for triggering the triac. Thus, a diac-triac combination is provided which possesses all of the aforementioned advantages.

DESCRIPTION OF THE DRAWINGS

These and other features and objects of the present invention will become more apparent upon a perusal of the following description taken in conjunction with the accompanying drawings wherein:

FIG. 1 is an elevation view of a prior art semiconductor assembly;

FIG. 2 is an elevation view of an improved assembly generally similar to that shown in FIG. 1;

FIG. 3 is a plan view of an improved metal mounting plate utilized in the assembly illustrated in FIG. 2;

FIGS. 4 and 5 illustrate alternate improved mounting plates;

FIGS. 6, 7 and 8 diagrammatically illustrate steps involved in manufacturing the improved semiconductor pellet mounting plates;

FIG. 9 illustrates a semiconductor assembly with yet another alternate improved mounting plate;

FIGS. 10 and 11 are plan and elevation views, respectively, of an improved semiconductor device assembly;

FIG. 12 illustrates a modification of the device depicted in FIGS. 11 and 12;

FIG. 13 is an isometric view of an isolated semiconductor assembly utilizing the device shown in FIGS. 10 and 11 mounted on a ceramic substrate;

FIG. 14 is an isometric view showing a modification of the substrate shown in FIG. 13;

DESCRIPTION OF THE PREFERRED EMBODIMENTS

Figure 15:
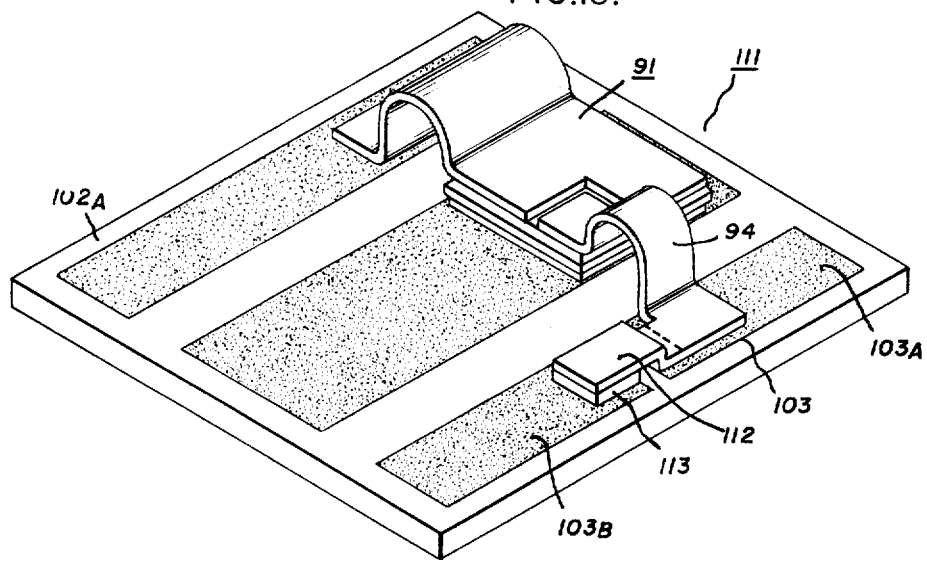
FIG. 15 depicts yet another alternative to the device shown in FIG. 13 wherein a second semiconductor pellet is included.

Referring first to FIG. 1, there is illustrated a prior art semiconductor assembly 21 including a semiconductor pellet 22 defining two substantially parallel major surfaces 23 and 24. The pellet 22 contains a preselected distribution of conductivity altering dopants such that a semiconductor device pellet 22 is formed. In general, the surfaces 23 and 24 support metallic contacts to facilitate establishing electrical coupling to the various conductivity altered regions of the pellet 22.

The metallic contacts on the surface of the pellet 22 are conventional and are not shown in FIG. 1 nor in most subsequent Figures in order to preserve clarity.

The pellet can comprise any semiconductive device such as, for example, a diode, an SCR, a triac, etc., and can be fabricated using any conventional techniques, such as glassivation, if desired. The pellet 22, as illustrated in FIG. 1, was grooved from each side prior to subdivision from a parent wafer. Thus, the double bevel at the periphery is formed. Such a method of subdividing pellets is old in the art.

Coupled to each of the major surfaces 23 and 24 is a metal plate 25 and 26, respectively. The coupling between the plates and the pellet provides electrical, mechanical, and thermal contact. Commonly, the coupling is provided by soldering the plates to the metallic contacts on the surface of the pellet.

Illustrated on each plate 25 and 26 are two burrs 27 that are formed when the plates are punched from larger stock as described above. It is these burrs that create the difficulties previously described with respect to the prior art.

Referring now to FIG. 2, there is shown an improved assembly 31 including the pellet 22. Mounted to the upper and lower surfaces 23 and 24 of the pellet are improved metal mounting plates 32 and 33. Two coupling systems, such as solder bonded to metallic contacts on the pellet 22, can be used to couple the pellet 22 and the plates 32 and 33.

The plates 32 and 33 are identical insofar as possible. For example, if the pellet 22 is a diode pellet, the plates can be identical. However, if it is assumed, for example, that the pellet 22 is an SCR pellet, the plate on the major surface with the SCR gate contact will have the portion overlying the gate contact removed. For example, the plate may have a corner punched out or an aperture put in the center. However, such modifications are minor and are not deemed inventive. Consequently, the plates 32 and 33, and the plates illustrated in subsequent Figures shall be treated as square plates, it being within the ability of those skilled in the art to change the shape as necessary.

Considering the plate 32 as typical, it will be appreciated that it defines two substantially parallel major surfaces 34 and 35, each surface defining an interior planar region bounded by a peripheral transition region 36. The peripheral transition regions render the peripheral corners of the metal plate recessed from and without the planes of the central planar regions. At least one of the central planar regions is adapted to receive the semiconductor pellet 22. The properties required to render the surface able to receive the pellet are well known to those skilled in the art and include such considerations as surface smoothness and bondability.

In FIG. 2, it will be observed that a burr 37 is on one peripheral corner. However, due to the peripheral transition region, the burr also is without the plane of the interior planar region. Consequently, the aforementioned problems that can occur due to the presence of the burr are alleviated. Preferably, the peripheral transition region 36 is small as compared to the interior planar regions to maximize the ratio of the area of the planar region to the entire area, thus providing efficient utilization of the plate area.

Referring now to FIG. 3, there is a plan view of the plate 32. Observation of FIG. 3 shows that the plate and the interior planar region are both square, and, furthermore, that the peripheral transition regions are formed on all sides of the square and thus the interior planar region is a central planar region. It is not necessary to form transition regions on all four sides of the plate to provide a plate with improved properties. However, it is felt that, inasmuch as some trimming of the plate on all four sides is necessary, freedom from burrs in maximized if the transition regions are formed on all sides. It should be realized that the square plate is shown as an example, and the plate could be other shapes, such as round or hexagonal.

The solder used to bond the semiconductor pellet 22 to the metal plate and the metal plate to a header (or other substrate) can consist of discrete preforms put in place and heated as is conventional in the prior art. Alternately and preferably one or both of the surfaces of the metal plate 32 can be solder clad. Solder cladding is advantageous inasmuch as it reduces the number of parts required for the assembly, prevents excessive solder buildup, and eliminates certain fixturing problems. The advantages of solder clad plates are clearly pointed out in my copending U.S. patent application entitled "Metallic Plate Semiconductor Assembly And Method For The Manufacture Thereof," filed Nov. 13, 1974, and assigned Ser. No. 523,343.

The choice of material for the metal plate 32 is well within the ability of those skilled in the art. Considerations involved in the choice are enumerated in my aforementioned copending application, Ser. No. 523,343.

The plate 32 as illustrated in FIGS. 2 and 3 included a straight beveled peripheral transition region. Referring now to FIGS. 4 and 5, alternate embodiments are shown. A plate 41 is illustrated in FIG. 4 and includes a step transition region 42 defining an interior planar region 43. It will be appreciated that functionally the plate 41 is similar to the plate 32.

Referring now to FIG. 5, there is illustrated a plate 45 with an arcuate transition region 46 defining an interior planar region 47.

Observation of FIGS. 4 and 5 makes plain that the plates 41 and 45 are used in the same manner as the plates 32 and 33 and provide the same advantages. All are considered excellent devices and the choice among them can be made primarily on the basis of which is easiest to manufacture with available tooling.

Referring now to FIGS. 6, 7, and 8, there is diagrammatically illustrated one method of fabricating the plate 41. Starting with a strip 51 of the chosen metal, as illustrated in FIG. 6, a series of transverse grooves 52 (only one of which is shown) is formed as illustrated in FIG. 7. As shown in FIG. 7, the strip 51 is advanced in steps in the direction of the arrow A and, between steps, two die 53 and 54, move in the direction indicated to form the double-sided grooves 52. Following the forming operation, the formed strip 51A is stepped in the direction of the arrow B, as illustrated in FIG. 8, between a die 55 and a platen 56. Between steps, the die 55 and the platen 56 come together shearing the strip 51A in the center of the grooves 52. Consequently, the strip 51A is separated into a plurality of the pellets 41. The cutting operation of the die and platen puts the burr around the periphery of the pellet. The size of the burr will vary and depends upon the sharpness of the die, the general condition of the equipment, the metal chosen for the plate, etc. However, it will be appreciated that when utilizing the subject metal mounting plate, a larger burr can be accommodated than otherwise would be possible. Thus, one benefit derived from the use of the subject plate is that the die 55 can be used longer inasmuch as a larger burr can be tolerated.

It should be appreciated that the steps illustrated in FIGS. 6, 7, and 8 are diagrammatic in nature. The techniques utilized to step the strip and drive the dies are conventional and, thus, need not be illustrated here. Further, the shape of the dies 53 and 54 will determine whether the plate to be formed takes the profile of the plate 32, 41, or 45.

Additionally, it should be realized that the steps illustrated in FIGS. 6, 7, and 8 are employed when strip material possessing edges that are relatively burr-free is being utilized.

If sheet material is being utilized, a first step may be to cut the sheets into strips. If that cutting operation generates burrs, it may be desired to pass rollers over the cutting path prior to cutting such that the peripheral transition regions are placed along the region where cuts are to be made. In that event the pellet 32, as illustrated in FIG. 3, with four peripheral transition regions 36 is fabricated. Or, rolling after cutting will remove the burrs from the sides of the strip.

Again, it should be stressed that the choice of methods for making any of the plates 32, 41, or 45 is well within the ability of those skilled in the art whether the plate is to have two or four peripheral transition regions.

Referring now to FIG. 9, there is illustrated an assembly 61 including the semiconductor pellet 22 coupled to a metal mounting plate 62 which is attached to a substrate, such as a header 63.

What is significant about the embodiment 61 is that the plate 62 includes a peripheral transition region 64 on only one side thereof. Manufacturing processes for the plate 62 are similar to those illustrated in FIGS. 6, 7, and 8 except that the dies used to form the grooves along the cutting line form a groove on only one side. Also, care should be taken to insure that the outting is performed in such a way that the burr 65 occurs on the side with the peripheral transition region. It will be appreciated that the second side of the plate 62 is planar and thus contains an interior or central planar region that, in fact, spans the entire surface thereof.

For certain applications the plate 62 may be preferable to any of the plates 32, 41, or 45. However, a difficulty may be encountered inasmuch as the plate 62 must be properly oriented if it is decided that the side with the peripheral transition region 64 is to be adjacent the semiconductor pellet 22.

As illustrated in FIG. 9, the peripheral transition region is a straight bevel. However, it should be appreciated that the arcuate and step configurations are also useful when placed on only one side of the plate 62.

Referring now to FIGS. 10 and 11, there is illustrated an assembly 91 including the pellet 22 and a lower mounting plate 41. Assume that the pellet 22 is an SCR with a corner gate. Shown in FIG. 10 is a metallic gate contact 92 and a metallic cathode contact 93. Soldered, or otherwise fastened to the gate contact, is a ribbon-shaped gate lead 94. Similarly, soldered or otherwise fastened to the cathode contact 93 is another ribbon lead 95. By ribbon shaped, it is meant that the leads 94 and 95 are substantially wider than they are high and thus are shaped more like ribbons than conventional wire leads.

As illustrated best in FIG. 11, the ribbon-shaped leads 94 and 95 are preferably upturned at the points A so that the leads and the peripheral corner of the major face of the pellet 22 to which they are attached remain spatially separated. Thus, the problem of solder collecting in the corner and flowing down the pellet is alleviated.

It will also be appreciated from an observation of FIGS. 10 and 11 that each lead has a terminal planar portion 96 and 97. Each terminal planar portion 96 and 97 is in the plane of the central planar region of the lower major surface of the plate 41. Thus, all three contacts are accessible in one plane and the assembly 91 can be placed on a properly patterned substrate such as a printed circuit board and quickly fastened in place.

The assembly 91 can be further improved if the surface of the leads 94 and 95 that is adjacent the pellet is solder clad. With the leads solder clad, the leads need only be placed in position on the pellet as illustrated in FIGS. 10 and 11 and heated in order to bond the lead to the pellet. Furthermore, if the lower surface of the plate 41 is solder clad also, the assembly 91 can simply be placed on a substrate such as a printed circuit board and the entire assembly heated to quickly and easily electrically, mechanically, and thermally bond the assembly 91 to the substrate. Thus, assembly 91 is well suited for device pellet sales.

Referring now to FIG. 12, there is shown an alternate assembly 91A including two leads 94A and 95A that are similar to the leads 94 and 95 except that the lower planar regions 96A and 97A are turned inward rather than outward as was illustrated in FIG. 11. A similar upturn occurs in the leads at a corresponding point in the embodiment 91A.

The choice between the embodiments 91 and 91A is based on several considerations. For example, it will be appreciated that the overall length of the embodiment 91A is shorter. However, the embodiment 91A can be more difficult to manufacture inasmuch as both sides of the ribbon leads 94A and 95A must be solder clad to obtain the benefits described above with respect to solder cladding only one side of the leads 94 and 95. Furthermore, the terminal planar regions 96A and 97A may have to be smaller than the counterparts in the embodiment 91.

It will be appreciated that the pellet may or may not be glassed and can be any pellet for any semiconductive device such as a diode, transistor, SCR, triac, etc. Thus, only one ribbon-shaped lead 95 or 95A may be needed.

Referring now to FIG. 13, there is shown an isolated semiconductor assembly 101 including the assembly 91 that was illustrated in FIGS. 10 and 11. A ceramic substrate 102 has laminated thereto a conductive planar lead 103. The lead can be laminated by any conventional method, for example, by the molymanganese process. The ceramic can be, for example, alumina or beryllia. A bonding portion of the lead 103 is in registry with the planar portion 96 of the ribbon-shaped lead 94 and bonded thereto. The portion of the lead 103 that is exposed in FIG. 13 constitutes a contact area for receiving connections to an external circuit.

A second planar conductive lead 104 is similarly laminated to the substrate 102 and a bonding area thereof is bonded to the lower surface of the plate 41. Similarly, the exposed portion of the lead 104 constitutes a contact area.

An additional planar conductive lead 105 is laminated to the substrate 102 and includes a contact area which is exposed and a bondng area which is bonded to the planar portion 97 of the lead 95.

The assembly 101 is extremely low in cost due to its simplicity and yet is highly reliable for several reasons. For example, each coupling whether it is between a ribbon-shaped lead and semiconductor pellet or between a ribbon-shaped lead and a planar lead is of a relatively large area and is thus secure. Furthermore, both the mounting plate 41 and the ceramic substrate 102 are good conductors of heat, and thus when the substrate is mounted to a heat sink by any conventional system which provides a good thermal path, the pellet 22 is able to dissipate a substantial amount of heat.

Three wiper arms 106 can be positioned on the contact areas of the leads 103, 104, and 105. Spring action can hold the leads 103–105 and the arms 106 in contact, or the arms can be permanently bonded to the contact areas with solder or the like. Thus, it will be appreciated that external connections can quickly be made to the assembly 101.

Referring now to FIG. 14, there is shown a modification of the substrate 102. The assembly 91 has been eliminated to simplify the Figure. Nailhead leads are permanently affixed to each of the contact areas and facilitate rapid connection to external circuitry.

Many connection methods will occur to those skilled in the art and the one used for establishing connections to the assembly 101 is simply a matter of choice.

Referring now to FIG. 15, there is shown a semiconductor assembly 111 including the ceramic substrate 102A bearing the semiconductor pellet assembly 91. In the assembly 111, the pellet 22 is a triac pellet and the planar conductive lead 103 is broken into two parts 103A and 103B. The planar portion 96 of the lead 94 is coupled to the area 103A. A diac pellet 113 is mounted on the area 103B and a ribbon-shaped lead 112, which can be an extension of the lead 94, connects the upper surface of the diac pellet to the area 103A and, thus, to the triac gate. If desired, the assembly consisting of the ribbon-shaped lead 112 and the diac pellet 113 can be separated from the lead 94 by dividing the two along the dotted lines shown in the Figure. Thus, there is provided an assembly similar to the assembly 101 but one which includes both a triac and a triggering diac.

Figure 16:
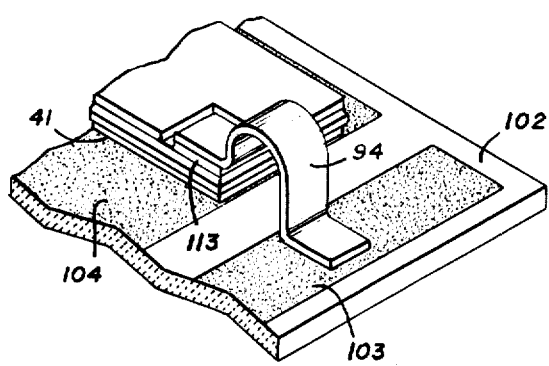
FIGS. 16 and 17 illustrate modifications of the assembly shown in FIG. 15.
Figure 17:
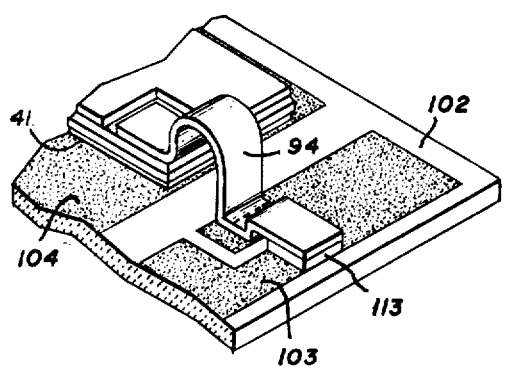

Referring now to FIG. 16, there is shown in detail a portion of an assembly similar to the assembly 111. In the embodiment shown in FIG. 16, however, the diac pellet 113 is sandwiched in a direct contacting relationship between the gate of the triac pellet 41 and the ribbon-shaped lead 94, thus simplifying the configuration of the lead 103. It will be observed that electrically the embodiments depicted in FIGS. 15 through 17 are all identical. If desired, the lead 94 can be divided along the dotted lines.

Figure 18:
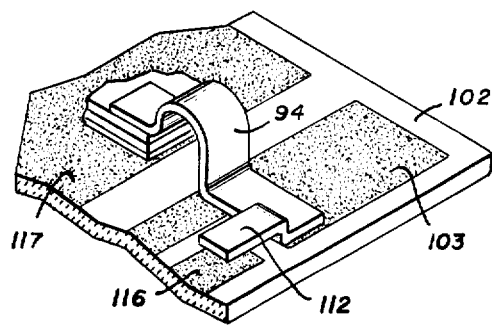
FIGS. 18 and 19, taken together, illustrate still another variation of the general type of assembly depicted in FIG. 15.
Figure 19:
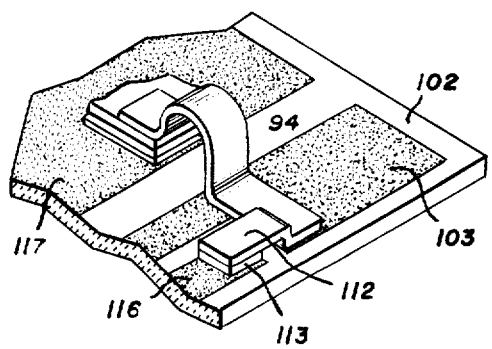

Referring now to FIG. 18, there is illustrated still another modification of the structure 111. The planar lead 103 has a corner 116 separated therefrom to form an auxiliary lead. It will be observed that when contact is made to the contact area 117 a connection is provided directly to the gate of the triac pellet. However, if a diac pellet 113 is sandwiched between the ribbon-shaped lead 112 and the auxiliary lead 116, the device is made electrically the equivalent of the structure 111 by making external circuit connections to the lead 116.

It will be appreciated that many modifications and variations of the present invention are possible in light of the above teachings. It is to be understood, therefore, that the invention can be practiced otherwise than as specifically described.

What is claimed is:
1. A semiconductor apparatus comprising:
   a semiconductor body defining first and second substantially parallel faces, said body containing a preselected distribution of conductivity altering impurities such that a semiconductive device pellet is formed, and wherein each of said faces has at least one metallic contact thereon in an electrically conductive relationship with said pellet;
   a metallic mounting plate defining first and second substantially parallel major surfaces, each of said major surfaces defining a central planar region and wherein at least said first major surface defines a peripheral transition region such that the peripheral corner of said first major surface is without the plane of the central planar region thereof, said peripheral corner of said first major surface having a burr projecting in the direction of the plane of said first major surface, but entirely without said plane, and wherein the central planar region of said first major surface and a metallic contact on said first face are in a face-to-face juxtaposition and are substantially coextensive;
   bonding means for electrically and mechanically uniting said semiconductor body and said mounting plate;
   at least one ribbon-shaped lead bonded to a metallic contact on said second face, a portion of said lead projecting beyond the periphery of said body and terminating with a planar portion in the plane of the central planar region of said second major surface; and a ceramic substrate with conductive planar leads laminated thereto, wherein a bonding area of one planar lead is in registry with and bonded to the central planar region of said second major surface, and a bonding area of another planar lead is in registry with and bonded to said planar portion of said ribbon-shaped lead, and each of said planar leads has a contact area spatially separated from said semiconductor body for connection to an external circuit.

2. Apparatus according to claim 1 wherein said lead is bonded to said contact by solder.

3. Apparatus according to claim 2 wherein said ribbon-shaped lead is upturned such that said lead and the periphery of said pellet are spatially separated.

4. Apparatus according to claim 2 wherein at least the surface of said lead that is adjacent to said metallic contact or said second face is solder clad.

5. Apparatus according to claim 4 wherein said ribbon-shaped lead is upturned such that said lead and the periphery of said pellet are spatially separated.

6. Apparatus according to claim 2 wherein said second face has an additional contact thereon and an additional ribbon-shaped lead couples said additional contact to an additional planar lead on said substrate.

7. Apparatus according to claim 6 wherein said additional planar lead has an additional contact area.

8. Apparatus according to claim 6 wherein said body of semiconductor material is a triac chip and said additional planar lead is electrically coupled to a gate contact area by a ribbon lead and diac pellet assembly.

9. Apparatus according to claim 8 wherein said additional planar lead has an additional contact area.

10. Apparatus according to claim 6 wherein a diac chip is disposed in a direct contacting relationship between said additional contact and said additional planar lead.

11. Apparatus according to claim 1 further comprising nailhead leads bonded to said contact areas.

12. A semiconductor apparatus comprising:
a semiconductor body defining first and second substantially parallel faces, said body containing a preselected distribution of conductivity altering impurities such that a semiconductive device pellet is formed, and wherein each of said faces has at least one metallic contact thereon is an electrically conductive relationship with said pellet;

a metallic mounting plate defining first and second substantially parallel major surfaces, each of said major surfaces defining a central planar region and wherein at least said first major surface defines a peripheral transition region such that the peripheral corner of said first major surface is without the plane of the central planar region thereof wherein the central planar region of said first major surface and a metallic contact on said first face are in a face-to-face juxtaposition and are substantially coextensive, said second major surface also defining a peripheral transition region such that the peripheral corner of said second major surface is without the plane of the central planar region of said second major surface, said peripheral corner of said second major surface having a burr projecting in the direction of the plane of said second major surface, but entirely without said plane;

bonding means for electrically and mechanically uniting said semiconductor body and said mounting plate;

at least one ribbon-shaped lead bonded to a metallic contact on said second face, a portion of said lead projecting beyond the periphery of said body and terminating with a planar portion in the plane of the central planar region of said second major surface; and a ceramic substrate with conductive planar leads laminated thereto, wherein a bonding area of one planar lead is in registry with and bonded to the central planar region of said second major surface, and a bonding area of another planar lead is in registry with and bonded to said planar portion of said ribbon-shaped lead, and each of said planar leads has a contact area spatially separated from said semiconductor body for connection to an external circuit.

13. Apparatus according to claim 12 wherein said lead is bonded to said contact by solder.

14. Apparatus according to claim 13 wherein said ribbon-shaped lead is upturned such that said lead and the periphery of said pellet are spatially separated.

15. Apparatus according to claim 13 wherein at least the surface of said lead that is adjacent to said metallic contact or said second face is solder clad.

16. Apparatus according to claim 15 wherein said ribbon-shaped lead is upturned such that said lead and the periphery of said pellet are spatially separated.

17. Apparatus according to claim 13 wherein said second face has an additional contact thereon and an additional ribbon-shaped lead couples said additional contact to an additional planar lead on said substrate.

18. Apparatus according to claim 17 wherein said additional planar lead has an additional contact area.

19. Apparatus according to claim 17 wherein said body of semiconductor material is a triac chip and said additional planar lead is electrically coupled to a gate contact area by a ribbon lead and diac pellet assembly.

20. Apparatus according to claim 19 wherein said additional planar lead has an additional contact area.

21. Apparatus according to claim 17 wherein a diac chip is disposed in a direct contacting relationship between said additional contact and said additional planar lead.

22. Apparatus according to claim 12 further comprising nailhead leads bonded to said contact areas.

* * * * *